(12) United States Patent
Kim et al.

(10) Patent No.: US 9,437,791 B2
(45) Date of Patent: Sep. 6, 2016

(54) LIGHT EMITTING DEVICE PACKAGE

(71) Applicant: LG INNOTEK CO., LTD., Seoul (KR)

(72) Inventors: Byung Mok Kim, Seoul (KR); Young Jin No, Seoul (KR); Bo Hee Kang, Seoul (KR); Hiroshi Kodaira, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 5 days.

(21) Appl. No.: 14/105,439

(22) Filed: Dec. 13, 2013

(65) Prior Publication Data

US 2014/0167095 A1 Jun. 19, 2014

(30) Foreign Application Priority Data

Dec. 14, 2012 (KR) .................. 10-2012-0146331

(51) Int. Cl.
*H01L 31/12* (2006.01)
*H01L 27/32* (2006.01)
*H01L 33/00* (2010.01)
*H01L 33/62* (2010.01)
*H01L 23/00* (2006.01)
(Continued)

(52) U.S. Cl.
CPC .............. *H01L 33/62* (2013.01); *H01L 24/48* (2013.01); *H01L 23/3677* (2013.01); *H01L 23/49822* (2013.01); *H01L 23/49827* (2013.01); *H01L 24/45* (2013.01); *H01L 2224/32245* (2013.01); *H01L 2224/45015* (2013.01); *H01L 2224/48091* (2013.01); *H01L 2224/48227* (2013.01); *H01L 2224/48235* (2013.01); *H01L 2224/48455* (2013.01); *H01L 2224/48997* (2013.01); *H01L 2224/73265* (2013.01); *H01L 2224/85951* (2013.01); *H01L 2924/00014* (2013.01); *H01L 2924/01322* (2013.01); *H01L 2924/12035* (2013.01); *H01L 2924/12041* (2013.01); *H01L 2924/12042* (2013.01); *H01L 2924/15174* (2013.01); *H01L 2924/15183* (2013.01); *H01L 2924/15787* (2013.01)

(58) Field of Classification Search
CPC ....... H01L 31/12; H01L 27/32; H01L 33/00; H01L 33/08; H01L 27/15; H01L 51/50
See application file for complete search history.

(56) References Cited

U.S. PATENT DOCUMENTS

| | | | | |
|---|---|---|---|---|
| 4,417,392 A | * | 11/1983 | Ibrahim et al. | 29/840 |
| 6,071,371 A | * | 6/2000 | Leonard et al. | 156/297 |
| 2002/0153618 A1 | | 10/2002 | Hirano et al. | |

(Continued)

FOREIGN PATENT DOCUMENTS

| | | |
|---|---|---|
| JP | 64-57725 A | 3/1989 |
| JP | 2000-101147 A | 4/2000 |

(Continued)

*Primary Examiner* — Mohammad Choudhry
(74) *Attorney, Agent, or Firm* — Birch, Stewart, Kolasch & Birch, LLP

(57) ABSTRACT

Disclosed is a light emitting device package including a package body including at least one electrode pad disposed on a surface thereof, a light emitting device disposed on the package body, the light emitting device being electrically connected to the electrode pad through a wire, and a via hole electrode passing through the package body, wherein the wire forms a stitch on at least one of the light emitting device and the electrode pad, the light emitting device package further includes a bonding ball disposed on the stitch, and the via hole electrode non-overlaps the stitch and the bonding ball in a vertical direction.

18 Claims, 5 Drawing Sheets

(51) Int. Cl.
  *H01L 23/367*  (2006.01)
  *H01L 23/498*  (2006.01)

(56) References Cited

U.S. PATENT DOCUMENTS

2007/0194415 A1* 8/2007 Seng et al. .................. 257/678
2008/0197461 A1* 8/2008 Yu et al. ..................... 257/673
2010/0072511 A1* 3/2010 Lin .................... H01L 21/486
  257/99
2011/0180919 A1* 7/2011 Jensen et al. ................ 257/690
2012/0132942 A1* 5/2012 Wang .................. H01L 33/486
  257/98

FOREIGN PATENT DOCUMENTS

| JP | 2006-32804 A | 2/2006 |
| JP | 2006-303069 A | 11/2006 |
| JP | 2007-173874 A | 7/2007 |
| JP | 2008-135526 A | 6/2008 |

* cited by examiner (a)  (b)

LIGHT EMITTING DEVICE PACKAGE

CROSS REFERENCE TO RELATED APPLICATION

This application claims priority under 35 U.S.C. §119 to Korean Patent Application No. 10-2012-0146331, filed in Korea on Dec. 14, 2012, which are hereby incorporated in its entirety by reference as if fully set forth herein.

TECHNICAL FIELD

Embodiments relate to a light emitting device package.

BACKGROUND

Light emitting devices such as light emitting diodes or laser diodes using Group III-V or II-VI compound semiconductor materials implement light with a variety of colors such as red, green and ultraviolet light based on thin film growth technologies and development of device materials, implement white light by using phosphor materials or combining two or more colors and have advantages such as low power consumption, semi-permanent lifespan, high response speed, safety and eco-friendliness, as compared to conventional light sources such as fluorescent lamps and incandescent lamps.

Accordingly, an application range of such a light emitting device has been extended to transmission modules of optical communication systems, light emitting diodes as replacements for cold cathode fluorescent lamps (CCFLs) constituting backlights of display devices such as liquid crystal displays (LCDs), and white light emitting diode lighting devices as replacements for fluorescent lamps or incandescent lamps, vehicle headlights and traffic lights.

A light emitting device package has a configuration in which a first electrode and a second electrode are disposed in a package body, and a light emitting device is disposed on the bottom of the package body and is electrically connected to the first electrode and the second electrode.

FIG. 1 is a sectional view illustrating a conventional light emitting device package.

The light emitting device package 100 includes a package body 110a, 110b or 110c to form a cavity structure and a light emitting device 140 disposed on the bottom of the cavity. A heat dissipation portion 130 may be disposed in a lower part of the package body 110a, 110b or 110c and the heat dissipation portion 130 and the light emitting device 140 may be fixed through a conductive adhesion layer.

A molding portion 150 disposed in the cavity protects the light emitting device 140 while surrounding the same. The molding portion 150 may include a phosphor 160. Light of a first wavelength region emitted from the light emitting device 140 may excite the phosphor 160 and light of a second wavelength region may be emitted from the phosphor 160.

FIG. 2 shows the region $A_1$ or $A_2$ of FIG. 1 in detail.

A wire 145 may contact the light emitting device 140 in the region $A_1$ and contact an electrode pad 70 in the region $A_2$. The wire 145 thinly and lengthily droops down to form a stitch shape in the region represented by $S_1$ in FIG. 2A and the region represented by $S_2$ in FIG. 2B.

As shown in FIG. 2A, the wire 145 contacts the electrode pad 70 to form a stitch and as shown in FIG. 2B, the wire 145 contacts a via hole electrode 80 provided in the package body 110b to form a stitch.

Although FIGS. 2A and 2B illustrate embodiments of the region $A_2$ of FIG. 1, the wire 145 may contact the electrode pad or the via hole-type electrode provided on the light emitting device 140 in the region $A_1$ of FIG. 1.

However, the conventional light emitting device package has the following problems.

In the case of the wire bonded as shown in FIG. 2B, a portion of the surface of the via hole electrode 80 may be depressed and, thus, the stitch of the wire may not be completely bonded to the via hole electrode.

SUMMARY

Embodiments provide a light emitting device package to secure stability and reliability of wire bonding.

In one embodiment, a light emitting device package includes a package body including at least one electrode pad disposed on a surface thereof, a light emitting device disposed on the package body, the light emitting device being electrically connected to the electrode pad through a wire, and a via hole electrode passing through the package body, wherein the wire forms a stitch on at least one of the light emitting device and the electrode pad, the light emitting device package further includes a bonding ball disposed on the stitch, and the via hole electrode non-overlaps the stitch and the bonding ball in a vertical direction.

The wire may have a diameter of 1/40 to 1.5/40 millimeters.

The bonding ball may include a body contacting the stitch and a tail disposed on the body.

The stitch may have a line width of 0.3 to 0.35 millimeters.

A distance from the light emitting device to the via hole electrode may be smaller than a distance from the light emitting device to the electrode pad.

The light emitting device package may further include a wall portion of the package body and the package body may include at least two ceramic layers.

The via hole electrode may be formed in at least one of the ceramic layers.

The via hole electrode may be electrically connected to the electrode pad and the light emitting device may be connected to the electrode pad through the wire.

The via hole electrode may be adjacent to an end of the package body.

The via hole electrode may be formed on at least one portion of edges of the package body.

A ratio of a diameter of the wire to a minimum width of the electrode pad may be 1:2 to 1:3.

The via hole electrode may include a frame disposed at a periphery of the via hole electrode and a conductive layer and a ceramic layer under the frame.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" may be included based on the element.

Figure 1:
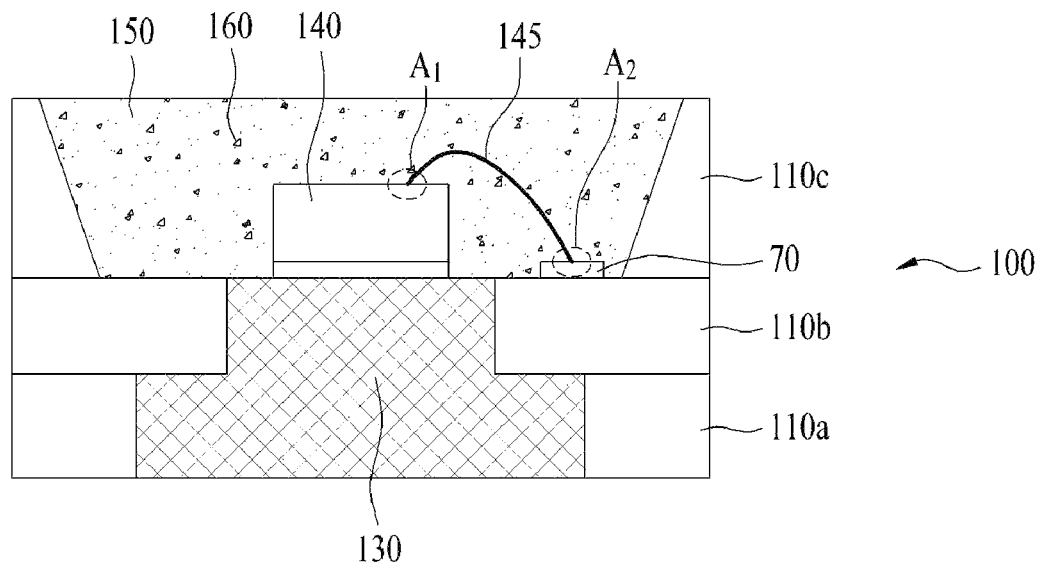
FIG. 1 is a sectional view illustrating a conventional light emitting device package.
Figure 2:
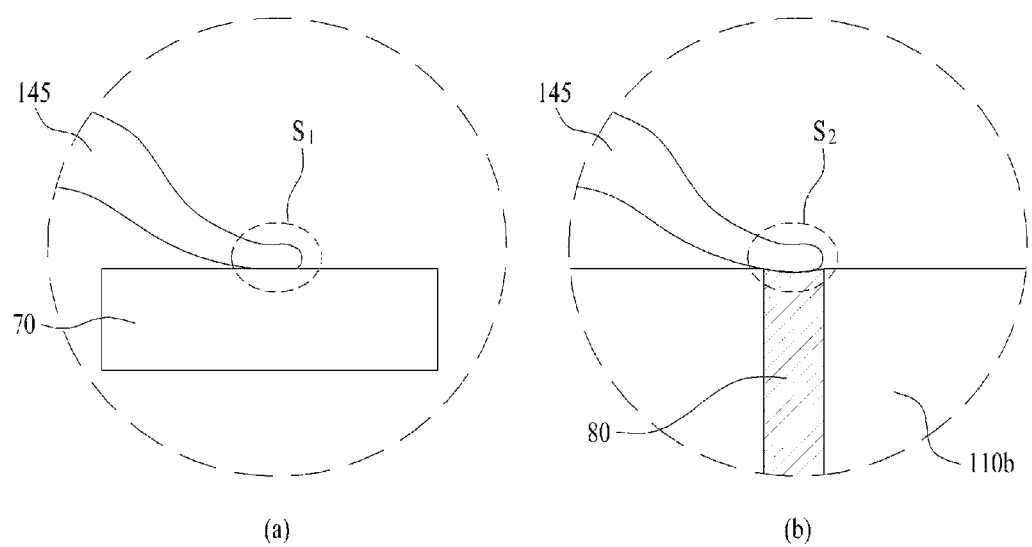
FIG. 2 shows a region $A_1$ or $A_2$ of FIG. 1 in detail.
Figure 3:
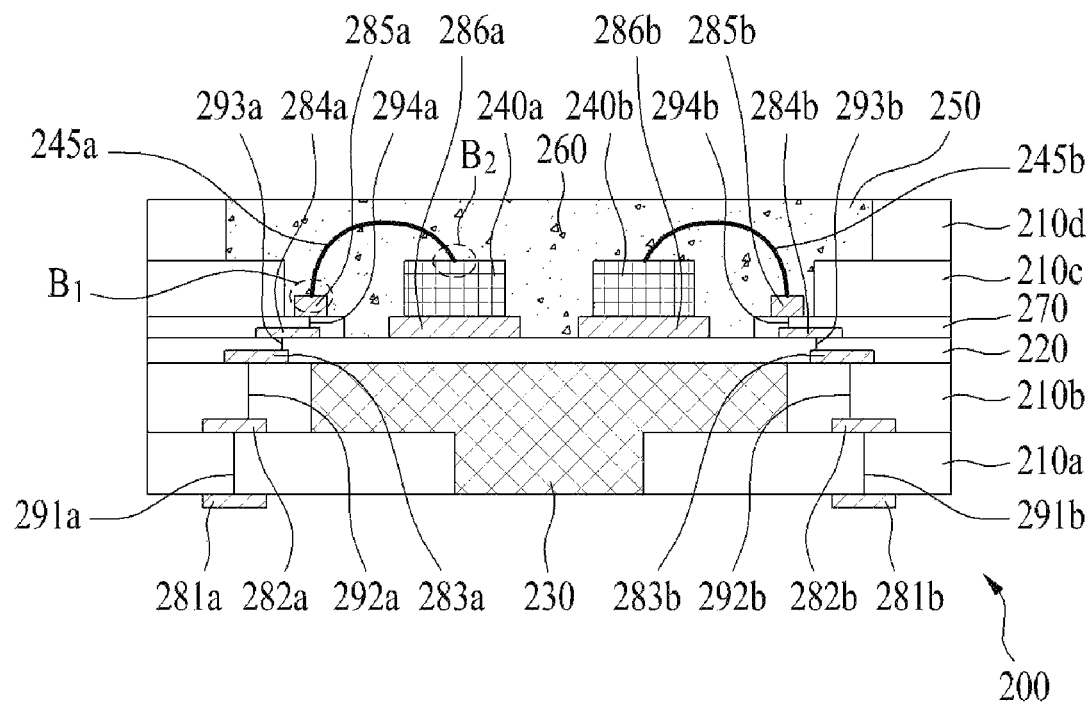
FIG. 3 is a sectional view illustrating a light emitting device package according to an embodiment.

FIG. 3 is a sectional view illustrating a light emitting device package according to an embodiment.

The light emitting device package 200 according to the present embodiment includes a package body having a plurality of first ceramic layers 210a, 210b, 210c and 210d. The package body may be implemented using a high temperature cofired ceramics (HTCC) method or a low temperature cofired ceramics (LTCC) method.

When the package body is a multilayer ceramic substrate, thicknesses of respective layers may be identical or different. The package body may be formed of a nitride or oxide insulating material and examples thereof include $SiO_2$, $Si_xO_y$, $Si_3N_y$, $SiO_xN_y$, $Al_2O_3$ and AlN.

Widths of the first ceramic layers 210a, 210b, 210c and 210d may be different, and some first ceramic layers 210a and 210b may constitute the light emitting device package 200 or the bottom of the cavity while the other first ceramic layers 210c and 210d may constitute a side wall of the cavity.

Light emitting devices 240a and 240b are disposed on the bottom of the cavity including the first ceramic layers 210a, 210b, 210c and 210d and two or more light emitting devices including the light emitting devices 240a and 240b may be disposed thereon.

A molding portion 250 surrounding the light emitting devices 240a and 240b and the wires 245a and 245b is disposed in the cavity. The molding portion 250 may include a silicone resin or a phosphor 260 and the phosphor 260 may convert light with a first wavelength region emitted from the light emitting devices 240a and 240b into light with a second wavelength region longer than the first wavelength region. For example, when the first wavelength region is an ultraviolet light region, the second wavelength region may be a visible light region.

In addition, hermetic sealing may be performed by eutectic-bonding or welding a metal deposited or platted on the molding portion 250 to a glass cap or lid, or by forming a step structure like the first ceramic layers 210d and 210c and then bonding an anti-reflective glass plate to the step groove through an adhesive agent (such as UV adhesive agent or thermosetting adhesive agent).

The light emitting device includes a light emitting diode (LED) including a plurality of compound semiconductor layers, for example, a plurality of semiconductor layers containing Group III-V elements. The light emitting device may be a color light emitting device emitting color light such as blue, green or red light or a UV light emitting device emitting UV light.

The light emitting devices 240a and 240b may be vertical light emitting devices or lateral light emitting devices, each of which may include a light emitting structure including a first conductive type semiconductor layer, an active layer and a second conductive type semiconductor layer.

The first conductive type semiconductor layer may be formed of a semiconductor compound, for example, a Group III-V or Group II-VI semiconductor compound. In addition, the first conductive type semiconductor layer may be doped with a first conductive type dopant. When the first conductive type semiconductor layer is an n-type semiconductor layer, the first conductive type dopant may include Si, Ge, Sn, Se or Te as the n-type dopant, but the disclosure is not limited thereto.

The first conductive type semiconductor layer may be formed of the first conductive type semiconductor layer alone or further include an undoped semiconductor layer disposed under the first conductive type semiconductor layer, but the disclosure is not limited thereto.

The undoped semiconductor layer is formed to improve crystallinity of the first conductive type semiconductor layer and may be the same as the first conductive type semiconductor layer, except that the undoped semiconductor layer has electrical conductivity lower than the first conductive type semiconductor layer because it is not doped with the n-type dopant.

The active layer may be formed on the first conductive type semiconductor layer. The active layer emits light which has an energy determined by an inherent energy band of the active layer (light emitting layer) material upon recombination of electrons injected through the first conductive type semiconductor layer and holes injected through the second conductive type semiconductor layer described later.

The active layer may have at least one of a double hetero junction structure, a mono-quantum well structure, a multi-quantum well (MQW) structure, a quantum wire structure and a quantum dot structure. For example, the double hetero junction structure may be formed by injecting trimethyl gallium gas (TMGa), ammonia gas ($NH_3$), nitrogen gas ($N_2$), or trimethyl indium gas (TMIn), but the disclosure is not limited thereto.

Well layer/barrier layer of the active layer for example may have at least one pair structure of InGaN/GaN, InGaN/InGaN, GaN/AlGaN, InAlGaN/GaN, GaAs(InGaAs)/AlGaAs, GaP(InGaP)/AlGaP, but the disclosure is not limited thereto. The well layer may be formed of a material having a smaller gap than the barrier layer.

A conductive clad layer (not shown) may be formed on or under the active layer. The conductive clad layer may be formed of a semiconductor having a band gap wider than the band gap of the barrier layer of the active layer. For example, the conductive clad layer may include GaN, AlGaN, InAlGaN or superlattice structure. In addition, the conductive clad layer may be doped with an n-type or p-type dopant.

In addition, the second conductive type semiconductor layer may be formed on the active layer. The second conductive type semiconductor layer may be formed of a semiconductor compound, for example, a Group III-V compound semiconductor doped with a second conductive type dopant. The second conductive type semiconductor layer 234c may for example be a semiconductor material having an empirical formula of $In_xAl_yGa_{1-x-y}N$ ($0 \leq x \leq 1$, $0 \leq y \leq 1$, $0 \leq x+y \leq 1$). When the second conductive type semiconductor layer is a p-type semiconductor layer, the second conductive type dopant is a p-type dopant, for example, Mg, Zn, Ca, Sr, Ba or the like, but the disclosure is not limited thereto.

Here, conversely, the first conductive type semiconductor layer may include a p-type semiconductor layer and the second conductive type semiconductor layer may include an n-type semiconductor layer. In addition, a third conductive type semiconductor layer including an n-type or p-type semiconductor layer may be formed on the first conductive type semiconductor layer. Thus, the light emitting devices 240a and 240b may have at least one of n-p, p-n, n-p-n and p-n-p junction structures.

The package body includes the first ceramic layers 210a, 210b, 210c and 210d made of an inorganic substance. For this reason, in spite of using a light emitting device 200 including a deep UV LED having a wavelength of about 280 nm or a near UV LED having a wavelength of about 365 to 405 nm, the package body may be neither discolored nor deformed due to UV light emitted from the light emitting device 200 and reliability of light emitting modules may thus be maintained.

In the present embodiment, the package body includes the four first ceramic layers 210a, 210b, 210c and 210d having the same thickness, but the package body may include more first ceramic layers and the respective first ceramic layers may have different thicknesses.

As shown in FIG. 3, the light emitting devices 240a and 240b are disposed on the surface of the package body. The light emitting devices 240a and 240b is disposed on the heat dissipation portion 230. The light emitting devices 240a and 240b are mounted on third ceramic layer 220 or the heat dissipation member 230 through the conductive adhesive layers 286a and 286b and a third ceramic layer 220. The heat dissipation portion 230 may be formed of a material having superior thermal conductivity, in particular, Cu, W or CuW. One heat dissipation portion 230 is shown in FIG. 3, but two or more heat dissipation portions including the heat dissipation portion 230 may be separately disposed.

The heat dissipation portion 230 may be disposed in at least one of first ceramic layers 210a and 210b, and a third ceramic layer 220 and an anti-crack portion 270 may be disposed on the heat dissipation portion 230 and the first ceramic layers 210a and 210b. The anti-crack portion 270 may include a second ceramic layer. A configuration including the third ceramic layer 220 and the anti-crack portion 270 disposed on the first ceramic layers 210a and 210b may be referred to as "package body". In this case, the first ceramic layers 210c and 210d may constitute a wall portion.

In addition, the anti-crack portion 270 is provided with an opening at a portion or central region thereof. The third ceramic layer 220 is exposed through the opening and the light emitting devices 240a and 240b are disposed in portions of the exposed region of the third ceramic layer 220, thus enabling the light emitting devices 240a and 240b to thermally contact the heat dissipation portion 230 through the third ceramic layer 220.

The first ceramic layers 210c and 210d constitute a sidewall of the cavity and electrical connection of the light emitting devices 240a and 240b in the light emitting device package 100 will be described below.

A plurality of first electrode patterns 281a to 284a and a plurality of second electrode patterns 281b to 284b are disposed on the first ceramic layers 210a and 210b, the third ceramic layer 220 and the anti-crack portion 270, and connection electrodes 291a to 293a and 291b to 293b are disposed between the respective first electrode patterns 281a to 284a and the respective second electrode patterns 281b to 284b. This configuration will be described in detail.

The heat dissipation layer 230 is disposed inside the first ceramic layers 210a and 210b, a first electrode pad 285a and a second electrode pad 285b are disposed in the anti-crack portion 270, and the light emitting devices 240a and 240b may be bonded to the first electrode pad 285a and the second electrode pad 285b through wires 245a and 245b, respectively. The bonding through the wire means electrical connection and the same applies hereinafter. In addition, the first electrode pad 285a and the second electrode pad 285b may be electrically connected to the first electrode pattern 284a and the second electrode pattern 284b through the connection electrodes 294a and 294b, respectively.

The connection electrodes 291a to 294a and 291b to 294b are formed by forming a via hole in the first ceramic layers 210a and 210b, the third ceramic layer 220 and the anti-crack portion 270 and filling the via hole with a conductive material and are also referred to as "via hole electrode" and the via hole electrodes are formed respectively in the ceramic layers, that is, the first ceramic layers 210a and 210b, and the third ceramic layer 220 and the anti-crack portion 270.

As shown in FIG. 3, the heat dissipation layer 230 and the second electrode patterns 281a and 281b may be exposed under the first ceramic layer 210a and may directly electrically contact a circuit substrate, and the heat dissipation layer 230 may serve as an electrode pattern.

In addition, the distance from the light emitting device to the via hole electrode is smaller than the distance from the light emitting device to the electrode pad.

Figure 4:
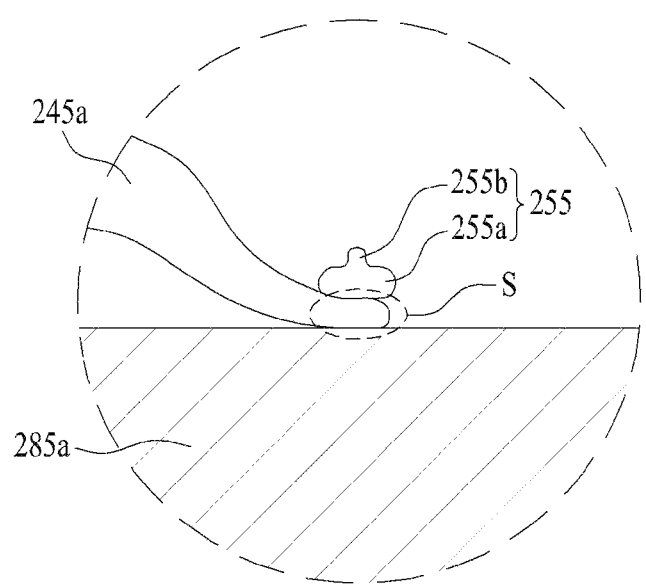
FIG. 4A shows a region $B_1$ of FIG. 3.
FIG. 4B shows an embodiment of a region $S_1$ or $S_2$ of FIG. 4A in detail.
FIG. 4C shows another embodiment of the region $S_1$ or $S_2$ of FIG. 4A in detail.
Figure 4:
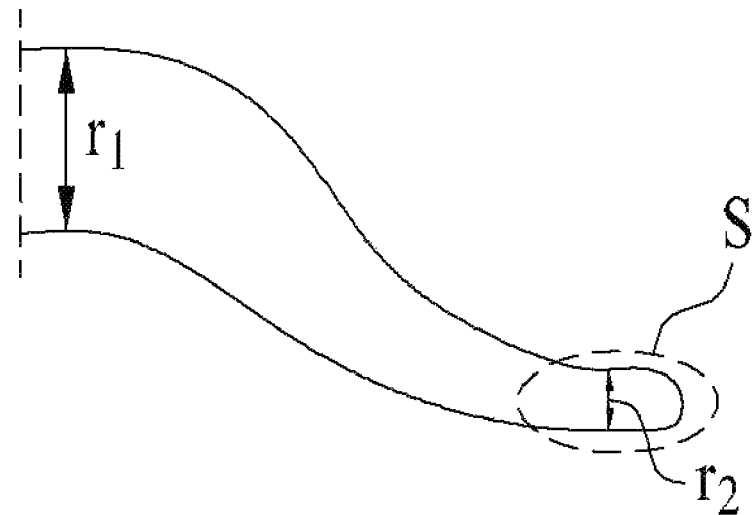
Figure 4C:
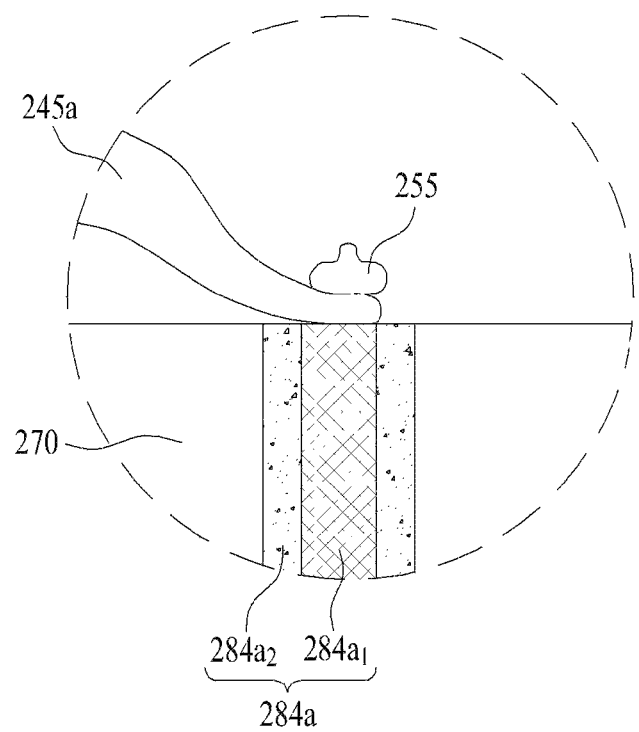

FIG. 4A shows the region $B_1$ of FIG. 3, FIG. 4B shows an embodiment of the region $S_1$ or $S_2$ of FIG. 4A in detail and FIG. 4C shows another embodiment of the region $S_1$ or $S_2$ of FIG. 4A in detail.

Hereinafter, the bonding structure of the wire of the light emitting device package will be described in detail with reference to FIGS. 4A to 4C.

As shown in FIG. 4A, a wire 245a is bonded to an electrode pad 285a, the wire 245a forms a stitch on the electrode pad 285a and a bonding ball 255 is disposed on the stitch to form a BBOS (ball bonding on stitch) structure. The bonding ball 255 may include a body 255a contacting the stitch and a tail 255b contacting an upper surface of the body 255a and having a size smaller than the body 255a.

Such a structure may be applied to the region $B_1$ where the wire 245a contacts the electrode pad 285a, as well as the region $B_2$ wherein the wire 245a contacts the light emitting devices 240a and 240b.

As shown in FIG. 4B, the wire 245a may have a diameter $r_1$ of 1 to 1.5 mil. When the diameter is excessively small, the wire 245 may be broken or damaged, and when the diameter is excessively great, the wire 245 may block or absorb light. Here, 1 mil corresponds to about 1/40 millimeters. The region represented by S in the wire 245a may be a stitch. The stitch may be formed while cutting the wire 245a during bonding of the wire 245a and may have a line width $r_2$ of 0.3 to 0.35 millimeters. The reason for defining the line width $r_2$ in the stitch, rather than the diameter, is that the stitch region may be partially pressed and thus form a circular shape, rather than an oval shape, when cutting an end of the wire 245a and the line width $r_2$ may mean a longitudinal diameter of the stitch.

In the embodiment shown in FIG. 4C, the wire 245a is directly connected to the connection electrode 294a which is the via hole formed in the ceramic layer, the anti-crack portion 270. As in the embodiment shown in FIG. 4C, the wire 245a is connected to the via hole 294a through the stitch and the bonding ball 255. The via hole 294a may pass through the anti-crack portion 270 and include a conductive layer $294_{a1}$ and a frame $294_{a2}$ disposed outside the conductive layer $294_{a1}$.

Figure 5:
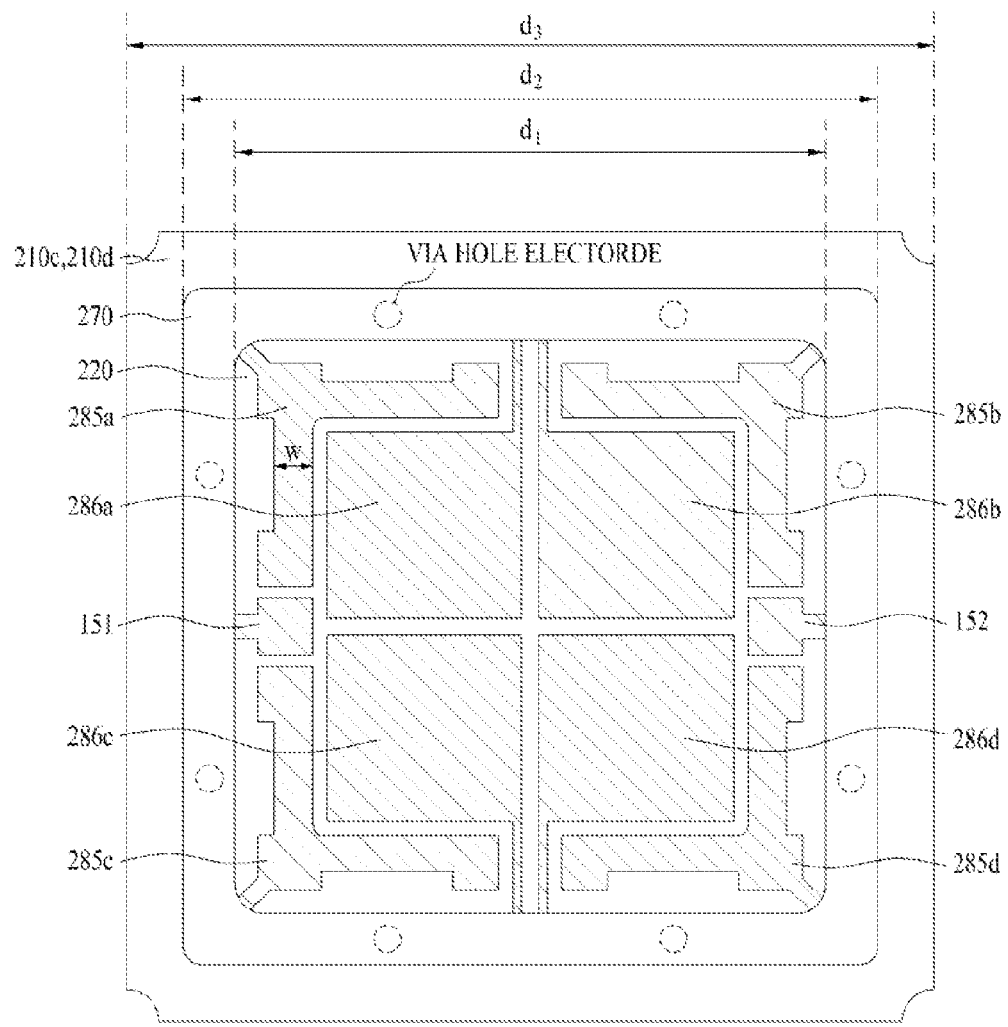
FIG. 5 is a view illustrating an electrode structure of the light emitting device package shown in FIG. 3.

The wire bonded by the BBOS method may have a hard bonding structure because the bonding ball presses the wire in the stitch region. In addition, as shown in FIG. 4C, because a stitch is bonded to a via hole and a ball is then bonded thereon, the upper surface of the via hole has a "depressed" or "through (hollow)" shape and the evenness thereof may thus be unstable. For this reason, the via hole may be disposed at the periphery of the package, as shown in FIG. 5. The via hole may be disposed such that it does not overlap the stitch and the bonding ball in a vertical direction.

FIG. 5 is a view illustrating an electrode structure of the light emitting device package shown in FIG. 3.

Because four light emitting devices are disposed in the light emitting device package, the four conductive adhesive layers 286a to 286b and the first to fourth electrode pads 285a to 285d may be disposed as shown in FIG. 5. The four conductive adhesive layers 286a to 286d may have identical polarity and the first to fourth electrode pads 285a to 285d have identical polarity wherein the polarity of the first to fourth electrode pads 285a to 285d may be different from that of the four conductive adhesive layers 286a to 286d.

As shown in FIG. 5, the first ceramic layers 210c and 210d constituting the sidewall of the cavity are disposed at the periphery of the light emitting device package, and the second ceramic layer constituting the anti-crack portion 270 and the third ceramic layer 220 constituting the bottom of the cavity are exposed in the center of the light emitting device package. As shown in FIG. 5, a width $d_3$ of the first ceramic layers 210c and 210d disposed in the uppermost part in FIG. 3 is the greatest, a width $d_2$ of the anti-crack portion 270 in the second upper part is narrower than the width $d_3$ and a width $d_1$ of the third ceramic layer 220 constituting the bottom of the cavity is the narrowest.

The four conductive adhesive layers 286a to 286d may be symmetrical to the first to fourth electrode pads 285a to 285d with respect to the dead center of the third ceramic layer 220 constituting the bottom of the cavity. A Zener diode may be disposed in two third electrode patterns 151 and 152.

The via hole electrode may be disposed in an outer part of the electrode pad. As shown in FIG. 5, the via hole electrode is disposed adjacent to an end of the package body and the via hole electrode is disposed in an outer part of the first to fourth electrode pads 285a to 285d represented by a dotted line. Two via hole electrodes are disposed on each of four edges of the anti-crack portion 270 which is the second ceramic layer constituting the package body. Because the via hole electrode is disposed in the outer part, the first to fourth electrode pads 285a to 285d to which the wire is bonded are disposed in a wider area as compared to a conventional structure and an active area of wire bonding is sufficiently secured.

In FIG. 5, the width of the electrode pad, that is, the width w of the first to fourth electrode pads 285a to 285d may 2 to 3 fold the diameter of the wire. When the width w is excessively small, bonding of the wire may be difficult and when the width w is excessively great, it may be difficult to suitably divide an inner area of the light emitting device package.

A plurality of light emitting device packages including the light emitting device package according to the embodiment are arrayed on a substrate, and a light guide plate, a prism sheet, a diffusion sheet and the like as optical members may be disposed on a light passage of the light emitting device package. The light emitting device package, the substrate and the optical members may serve as a light unit. In another embodiment, display devices, indicator devices and lighting systems including the semiconductor light emitting device or the light emitting device package mentioned in the embodiments may be implemented. For example, the lighting systems may include lamps, streetlamps and the like. Hereinafter, a headlamp and a backlight unit as embodiments of a lighting system in which the light emitting device package is disposed will be described.

Figure 6:
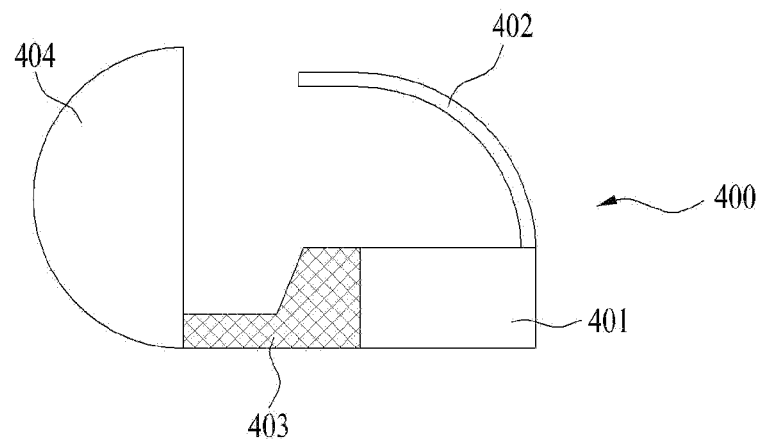
FIG. 6 is a sectional view illustrating a headlamp including the light emitting device package according to an embodiment.

FIG. 6 is a sectional view illustrating a headlamp including the light emitting device package according to an embodiment.

In the headlamp 400 according to the present embodiment, light emitted from a light emitting device module 401 in which the light emitting device package is disposed is reflected by a reflector 402 and a shade 403, passes through a lens 404 and travels towards the front of the body.

As mentioned above, in the light emitting device package used for the light emitting device module 401, a wire may have a hard bonding structure by bonding the wire by a BBOS method, and electrode pads to which the wire is bonded may be disposed in a wider area, as compared to a conventional structure by disposing the via hole electrode in an outer part and an active area of wire bonding may be thus sufficiently secured.

Figure 7:
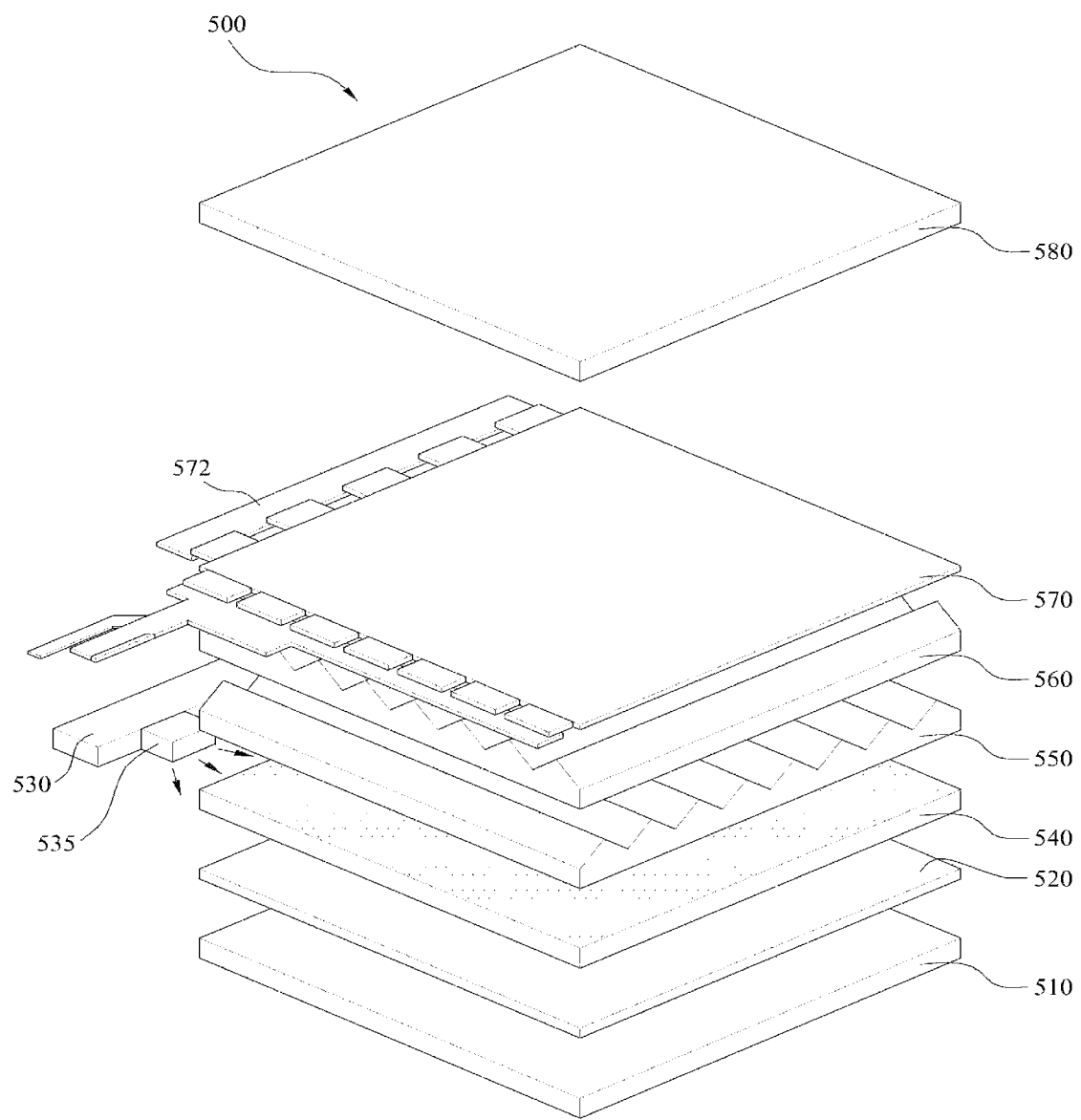
FIG. 7 is a sectional view illustrating an image display device including the light emitting device package according to an embodiment.

FIG. 7 is a sectional view illustrating an image display device 500 including the light emitting device package according to an embodiment.

As shown in FIG. 7, the display device 500 according to the present embodiment includes a light source module, a reflector 520 disposed on a bottom cover 510, a light guide plate 540 which is disposed in front of the reflector 520 and guides light emitted from the light source module toward the front of the image display device, a first prism sheet 550 and a second prism sheet 560 disposed in front of the light guide plate 540, a panel 570 disposed in front of the second prism sheet 560, and a color filter 580 disposed in front of the panel 570.

The light source module includes a light emitting device package 535 disposed on a circuit substrate 530. The circuit substrate 530 may be a PCB or the like and the light emitting device package 535 has been described in FIG. 3 above.

The bottom cover 510 may accommodate constituent components of the image display device 500. The reflector 520 may be provided as a separate component, as shown in the drawing, or may be provided by coating a highly reflective material on the rear surface of the light guide plate 540 or the front surface of the bottom cover 510.

The reflector 520 may be formed using a highly reflective and ultrathin material. Examples of such material include polyethylene terephthalate (PET).

The light guide plate 540 scatters light emitted from the light emitting device package module to uniformly distribute the light over the overall screen region of the liquid crystal display device. Accordingly, the light guide plate 530 is made of a material having a high index of refraction and a high transmittance and examples thereof include polymethylmethacrylate (PMMA), polycarbonate (PC), polyethylene (PE) and the like. In addition, when the light guide plate 540 is omitted, an air guide-type display device may be implemented.

The first prism sheet 550 is formed using a light-transmitting elastic polymer on a surface of a support film, and the polymer may have a prism layer in which a plurality of three-dimensional patterns is repeatedly formed. The patterns may be provided in the form of stripes including repeatedly disposed ridges and valleys.

The direction of the ridges and valleys on a surface of the support film in the second prism sheet 560 may be perpendicular to the direction of ridges and valleys on a surface of the support film in the first prism sheet 550. This aims to uniformly distribute light transferred from the light source module and the reflective sheet in all directions of the panel 570.

In the present embodiment, the first prism sheet 550 and the second prism sheet 560 constitute an optical sheet. The optical sheet may be provided as another combination such as a micro lens array, a combination of a diffusion sheet and a micro lens array, or a combination of one prism sheet and a micro lens array.

A liquid crystal display may be disposed in the panel 570 and other display devices requiring a light source in addition to the liquid crystal display may be provided.

The panel 570 has a structure in which liquid crystal is interposed between two glass bodies and a polarization plate is mounted on the glass bodies to utilize polarization of light. Liquid crystal has an intermediate property of a liquid and a solid. Liquid crystal is a flowable organic molecule like a liquid and is regularly disposed like a crystal. Images are displayed based on change of the molecular arrangement of the liquid crystal due to an applied electric field.

The liquid crystal display used for display devices may be of an active matrix-type and use a transistor as a switch to control voltage supplied to each pixel.

A color filter 580 is provided on the front surface of the panel 570 so that red, green or blue light among light projected from the panel 570 is selectively transmitted in each pixel and an image is displayed.

As apparent from the fore-going, in the light emitting device package disposed in the image display device according to the present embodiment, wire bonding structure is hard because the wire is bonded by a BBOS method and electrode pads to which the wire is bonded are disposed in a wider area, as compared to a conventional light emitting device package, and an active area of wire bonding is thus sufficiently secured, because the via hole electrode is disposed in an outer part.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
 a package body including at least one electrode pad disposed on a surface thereof, the package body including at least one ceramic layer;
 a via hole electrode passing through the package body;
 a heat dissipation portion disposed in the package body;
 an anti-crack portion disposed on the heat dissipation portion and the at least one ceramic layer; and
 a light emitting device disposed on the package body, the light emitting device being electrically connected to the electrode pad through a wire,
 wherein the wire forms a stitch on at least one of the light emitting device and the electrode pad, and a bonding ball is disposed on the stitch,
 wherein the heat dissipation portion is made of a material different from a material of the package body,
 wherein a width of an upper surface of the heat dissipation portion is bigger than a width of a lower surface of the heat dissipation portion,
 wherein the package body includes a first ceramic layer, a second ceramic layer, and a third ceramic layer,
 wherein the second ceramic layer is the anti-crack portion,
 wherein the second ceramic layer is disposed with an opening on the third ceramic layer,
 wherein the light emitting device is disposed on an exposed region of the third ceramic layer,
 wherein the third ceramic layer is disposed between the first ceramic layer and the anti-crack portion,
 wherein a lower surface of the third ceramic layer contacts the heat dissipation portion and the first ceramic layer, and
 wherein an upper surface of the third ceramic layer contacts the anti-crack portion and the light emitting device.

2. The light emitting device package according to claim 1, wherein the via hole electrode non-overlaps the stitch and the bonding ball in a vertical direction.

3. The light emitting device package according to claim 1, wherein the wire has a diameter of 1/40 to 1.5/40 millimeters.

4. The light emitting device package according to claim 1, wherein the bonding ball comprises:
 a body contacting the stitch; and
 a tail disposed on the body.

5. The light emitting device package according to claim 1, wherein the stitch has a line width of 0.3 to 0.35 millimeters.

6. The light emitting device package according to claim 1, wherein a distance from the light emitting device to the via hole electrode is longer than a distance from the light emitting device to the electrode pad.

7. The light emitting device package according to claim 1, further comprising a wall portion of the package body.

8. The light emitting device package according to claim 1, wherein the via hole electrode is disposed in each of the ceramic layers.

9. The light emitting device package according to claim 1, wherein the via hole electrode is electrically connected to the electrode pad and the light emitting device is connected to the electrode pad through the wire.

10. The light emitting device package according to claim 1, wherein the via hole electrode is adjacent to an end of the package body.

11. The light emitting device package according to claim 1, wherein the via hole electrode is disposed on at least one portion of edges of the package body.

12. The light emitting device package according to claim 1, wherein a ratio of a diameter of the wire to a width of the electrode pad is 1:2 to 1:3.

13. The light emitting device package according to claim 1, wherein the via hole electrode comprises:
 a frame disposed at a periphery of the via hole electrode; and
 a conductive layer disposed in the frame.

14. A light emitting device package comprising:
 a package body including at least one electrode pad disposed on a surface thereof;
 a heat dissipation portion disposed in the package body;
 a light emitting device disposed on the package body, the light emitting device being electrically connected to the electrode pad through a wire; and a wire electrically connected to the light emitting device and the electrode pad, wherein a bonding ball is disposed on the wire in regions in which the wire contacts the light emitting device and the electrode pad, wherein a recess is disposed on a surface of the electrode pad in a region in which the electrode pad contacts the wire, wherein the package body includes a first ceramic layer, a second ceramic layer, and a third ceramic layer, wherein the second ceramic layer is the anti-crack portion, wherein the second ceramic layer is disposed with an opening on the third ceramic layer, wherein the light emitting device is disposed on an exposed region of the third ceramic layer, wherein the third ceramic layer is disposed between the first ceramic layer and the anti-crack portion, wherein a lower surface of the third ceramic layer contacts the heat dissipation portion and the first ceramic layer, and wherein an upper surface of the third ceramic layer contacts the anti-crack portion and the light emitting device.

15. The light emitting device package according to claim 14, wherein the bonding ball comprises:
a body contacting the wire; and
a tail disposed on the body.

16. The light emitting device package according to claim 14, wherein a ratio of a diameter of the wire to a width of the electrode pad is 1:2 to 1:3.

17. The light emitting device package according to claim 14, wherein a diameter of the wire in regions in which the wire contacts the light emitting device and the electrode pad is longer than a diameter of the wire in other regions.

18. The light emitting device package according to claim 14, wherein the electrode pad includes a frame and a conductive layer disposed in the frame, and the conductive layer is disposed in a region corresponding to the bonding ball.

* * * * *